United States Patent [19]
Gonsiorawski

[11] 4,078,945
[45] Mar. 14, 1978

[54] ANTI-REFLECTIVE COATING FOR SILICON SOLAR CELLS

[75] Inventor: Ronald Gonsiorawski, Danvers, Mass.

[73] Assignee: Mobil Tyco Solar Energy Corporation, Waltham, Mass.

[21] Appl. No.: 682,565

[22] Filed: May 3, 1976

[51] Int. Cl.² .......................................... H01L 31/06
[52] U.S. Cl. ............................ 136/89 CC; 156/662; 427/75; 427/93
[58] Field of Search ............... 136/89 CC; 427/75, 93; 156/17, 662

[56] References Cited
U.S. PATENT DOCUMENTS

| 3,091,555 | 5/1963 | Smythe et al. | 427/83 |
| 3,966,517 | 6/1976 | Claes et al. | 156/7 |

FOREIGN PATENT DOCUMENTS

| 1,934,751 | 1/1971 | Germany | 136/89 CC |

Primary Examiner—John H. Mack
Assistant Examiner—Aaron Weisstuch
Attorney, Agent, or Firm—Schiller & Pandiscio

[57] ABSTRACT

An anti-reflective coating is formed integrally with a silicon solar cell by treating the cell with an acidic solution comprising a mixture of HF and $H_2O_2$.

16 Claims, 8 Drawing Figures

ANTI-REFLECTIVE COATING FOR SILICON SOLAR CELLS

This invention relates to apparatus for converting solar energy into electrical energy and more particularly to solar cells having improved anti-reflective coatings thereon and to methods for forming the improved coatings.

Generally, a solar cell includes a semiconductor body having both P- and N-type semiconductor materials which form a P/N junction. It is well known that actinic radiation of an appropriate wavelength falling on this P/N junction serves as a source of external energy to generate hole-electron pairs in the body to produce a potential difference at the junction. The electrons and electron-holes thus in effect move across the junction in opposite directions to provide a source of electric current which is capable of delivering current to an external source.

Solar cells generally are sensitive only to incident radiation lying within a relatively narrow portion of the solar radiation spectrum. For example, in the case of conventional silicon cells the sensitive band is considered to fall in the range of between about 0.4 and 1.1 microns in wavelength, with the upper limit being determined for silicon by the fact that its energy gap causes it to be transparent to wavelengths substantially greater than about 1.1 microns. Actually, most Silicon solar cells intended for terrestrial use are generally designed to operate at a principal peak of about 0.55 microns; cells intended for use in space generally are designed to operate at a principal peak of about 0.4 microns. However, silicon solar cells are relatively reflective to solar radiation in this wavelength range. For example, reflectivity from a substantially flat uncoated silicon solar cell of normally incident light of 0.55 micron wavelength is about 30 percent. Such reflection obviously lowers the conversion efficiency of the solar cell.

To minimize this undesired reflection, the art has proposed various anti-reflective coatings for covering the radiation receiving surfaces of the cell. Such coating generally comprises a material which is substantially transparent to solar radiation incident upon the cell, but is capable of reflecting back towards the radiation receiving surfaces of the cell, much of the light energy reflected from the cell. Known anti-reflective coatings generally comprise a thin layer of a material such as silicon monoxide, tantalum oxide, titanium oxide, silicon dioxide, or magnesium fluoride. While such anti-reflective coatings are fairly effective, they are relatively expensive to produce. The coatings are usually formed in situ on the cell using classical deposition techniques such as vapor deposition or sputtering, which are relatively costly techniques and also may involve substantial capital investment. Furthermore, some of the known anti-reflective coatings are relatively heat sensitive. For example, silicon monoxide coatings degrade when exposed to temperatures above about 50° C. for 200 hours. Thus, prior art solar cells generally also require cover slides or interference filters which are substantially reflective to incident light in the near and infrared wavelength region. Such reflected light is not available for conversion to electrical energy, so that the solar cell must operate on only that portion of the total solar energy lying within the pass band of the filter. Further, known solar cells may also require means for cooling the solar cell, i.e., to protect the anti-reflective coating.

It is therefore a general object of the present invention to provide an anti-reflective coating for a silicon solar cell which substantially avoids or overcomes a number of problems encountered in prior art anti-reflective coatings.

More specific objects of the present invention are to provide an anti-reflective coating for a silicon solar cell which is relatively inexpensive to produce and is stable under most normally expected operating temperatures.

Other objects of the present invention are to provide an anti-reflective coating for a silicon solar cell which can be made from commercially available materials at relatively low cost and using readily available, low cost equipment.

Yet other objects of the present invention are to provide an improved anti-reflective coating for a silicon solar cell, which enhances the conversion efficiency of the cell; and also to provide a method for forming an improved anti-reflective coating on a silicon solar cell and to substantially simultaneously enhance the conversion efficiency of the solar cell.

In order to accomplish the foregoing objects, the present invention comprises forming an anti-reflective coating on the radiation receiving surface of a silicon solar cell by treating the radiation receiving surface of the cell with an acidic solution comprising a mixture of HF and $H_2O_2$. In one embodiment of the invention the electrodes are applied to the cell prior to treating the cell to form the anti-reflective coating. In another embodiment the anti-reflective coating is applied first on selected portions of the cell surface, while the remaining portions are masked during the coating application to provide an uncoated pattern for subsequent attachment of the electrodes.

Still other objects of the present invention are set forth or rendered obvious by the following detailed description of the invention which is to be considered together with the accompanying drawings wherein.

In the several views, like numerals refer to like parts.

Silicon solar cells made by various techniques may be used in the practice of this invention. In this connection it is to be noted that it is common practice to fabricate solar cells starting with a substantially flat semi-conductor grade silicon body. Another technique is predicated on the use of seim-conductors which are grown in tubular form. Generally, a tubular body of either an N- or P-type conductivity can be grown in accordance with processes well known in the art (see, for example, U.S. Pat. Nos. 3,591,348, 3,826,625, 3,687,633, 3,870,477, 3,129,061, 3,162,507 and 3,394,994). The body is treated to provide a zone of opposite type conductivity so that a P-N junction is created between such zone and the adjacent portion or portions of the hollow body. The zone of opposite type conductivity may be formed in various ways known to persons skilled in the art, e.g. by diffusion or ion implantation of dopants or by epitaxial deposition of opposite type conductivity material. Further information regarding the construction and fabrication of solar cells is provided by U.S. Pat. Nos. 3,359,137, 3,575,721, 3,116,171, 3,150,999, 3,778,312, 3,489,615, 3,378,407, 3,546,542, 3,811,954, 3,459,597, 3,411,050, 3,175,929, 3,361,594, 3,615,853, 3,682,708, 3,089,070, 3,589,946, 3,686,036, 3,539,883 and 3,769,091. In all the techniques described, a pair of electrodes is provided so as to collect current from the solar cell. One electrode typically comprises a grid of conductors applied to and forming an ohmic contact with the outer, light-gathering surface of the cell. The other electrode usually is in the form of a continuous layer of electrically-conductive material provided on and forming an ohmic contact with the cell's opposite surface.

Figure 1:
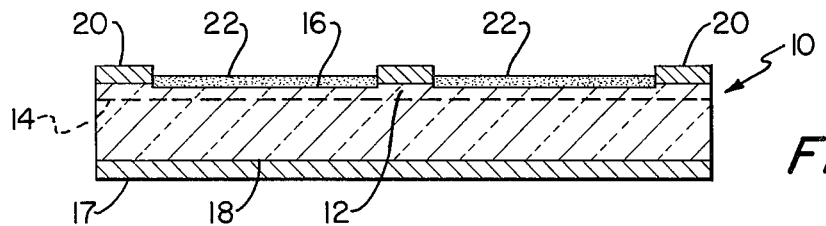
FIG. 1 is a sectional view in side elevation of a preferred embodiment of solar cell in accordance with the present invention.

Referring to FIG. 1, a typical embodiment of solar cell embodying the preferred form of the present invention comprises a flat semi-conductor silicon body 10 of P-type conductivity which has been treated to provide a zone 12 of N-type conductivity and a P-N junction 14 near one surface 16 which is to form the solar radiation gathering or receiving portion of the cell. As is well known in the art (see U.S. Pat. Nos. 3,359,137, 3,489,615, 3,686,036, 3,713,893 and 3,811,954) it is customary to provide an electrode 17 covering most of the shaded surface 18 of the cell (i.e., the surface opposite surface 16) and a second electrode in the form of a grid of current collectors overlying a portion of the surface 16. Typically, the grid consists of a plurality of relatively narrow spaced conductors 20 intersected by one or more relatively wide conductors (not shown). An anti-reflective coating 22 formed in accordance with this invention is provided on the light gathering surface 16 of the cell except where the grid-like electrode overlies the surface.

The coating thickness may be very thin, but for the sake of clarity the relative thickness of coating 22 in the drawing has been exaggerated. Generally the coating thickness will be in the range of about 0.07 to 0.15 microns. Preferably, however, the coating thickness should be approximately ¼ the wavelength of the primary frequency of light the cell is designed to capture. Thus, for a solar cell designed for terrestrial use at a principal peak wavelength of about 0.55 micron, coating 22 preferably should be about 0.13 microns thick while a solar cell designed for use in space at a principal peak wavelength of about 0.3 micron should have coating 22 with a thickness of about 0.07 microns.

Figure 2:
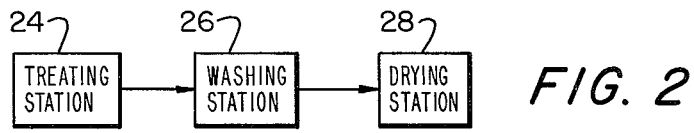
FIG. 2 is a block flow diagram illustrating a preferred embodiment of method for forming a solar cell in accordance with the present invention.

FIG. 2 is a block flow diagram illustrating a preferred method for forming the coating 22 on a solar cell which already includes electrodes as shown in FIG. 1. Referring to FIG. 2, the first step of the process involves treating the radiation receiving surface of a silicon solar cell with an acidic solution at a treating station 24, using as the acidic treating solution a mixture of HF and $H_2O_2$. This acidic treating step typically is conducted either at ambient temperature or the temperature of the acidic treating solution may be slightly elevated. However, since the treating time typically is quite fast, e.g. about 3 seconds at ambient temperature, operating at higher temperatures is not preferred since it may decrease the required immersion time to a point where control of the thickness of the resulting coating may become somewhat difficult to maintain. Treating may be by spraying the solution onto the cell. Preferably, however, the cell is simply immersed into a body of the aforesaid acidic solution and quickly removed.

Treating with the acidic solution as above described results in the elimination of silicon oxides and the formation or growth of an anti-reflective stain coating on the exposed silicon surfaces of the cell. The junction depth is also thinned by the acidic treatment as above described.

The relative ratio of HF to $H_2O_2$ in the treating solution is not particularly critical to the invention; the ratio may be varied over a relatively wide range and still provide a stain coating which has the desired anti-reflective properties for solar cells. Typically, the relative amounts of HF and $H_2O_2$ in the mixture will be adjusted to comprise between about 10 to about 2 parts by volume of HF (49% bottle concentration) and between about 2 to about 1 parts by volume of 30% $H_2O_2$ (stabilized, e.g., with sodium stannate).

Since the acidic treating solution is also relatively corrosive to metal electrodes, it is preferable to dilute the treating solution, e.g., with water. A preferred diluted acidic treating solution in accordance with the present invention comprises about 3 parts of 49% HF (bottle concentrated) and 1 part of $H_2O_2$ (stabilized) in 30 parts of deionized water (all parts by volume). Other materials which are relatively non-corrosive to the metal electrodes and to the silicon substrate, such as acetic acid, phosphoric acid, and mixtures of one or more of these acids with water, for example, 3 parts of 49% HF (bottle concentration) and 1 part of 30% $H_2O_2$ (stabilized) in 8 parts of a diluent mixture comprising equal parts of deionized water, reagent grade acetic acid (96%) and reagent grade phosphoric acid (98%) (all parts by volume) may be employed in accordance with the present invention.

Although the exact chemical nature of the coating and the nature of the bonding forces between the coating and the cell are not known with certainty, the anti-reflective coating 22 of the invention is believed to comprise a substantially uniform layer of $SiO_xF_y(OH)_z$ (where $x$, $y$ and $z$ are integers), and this compound is believed to provide the desired anti-reflective characteristics. The coating also is believed to be formed integrally with a portion of the upper surface of the radiation receiving surface of the solar cell. Treating a solar cell in the above manner may also result in a small amount of dopant being leached from the cell, and this leached dopant may also become included in the coating.

Once a coating of desired thickness is formed, the cell is removed from the treating station 24 and the cell with the formed coating is passed to a washing station 26 where traces of the treating solution are removed, e.g. by washing the cell using deionized water. The cell is then dried under inert gas at a drying station 28. The solar cell is now ready for use and can be connected with a circuit without further treatment. In this connection it is to be noted that the electrodes are substantially uneffected by the treatment resulting in formation of coating 22.

Figure 3:
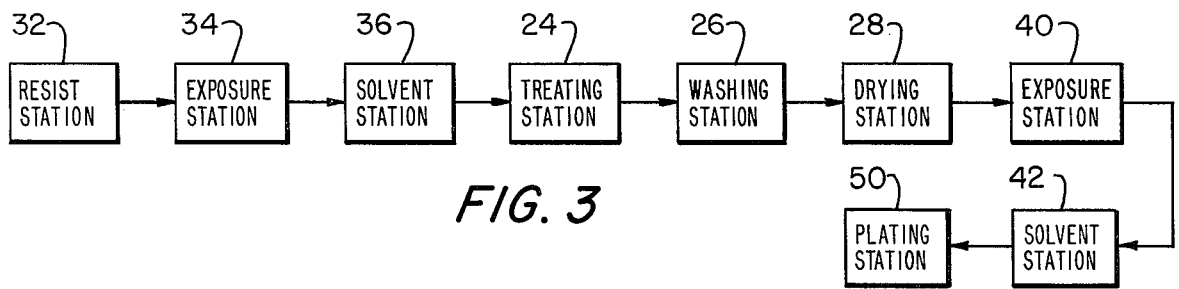
FIG. 3 is a block flow diagram illustrating an alternative process according to the present invention.

A possible alternative method is illustrated in FIG. 3 of the drawings. This alternative method differs from that of FIG. 2 above described in that the anti-reflective coating 22 is formed on the solar cell prior to attaching the electrodes.

Figure 4A:
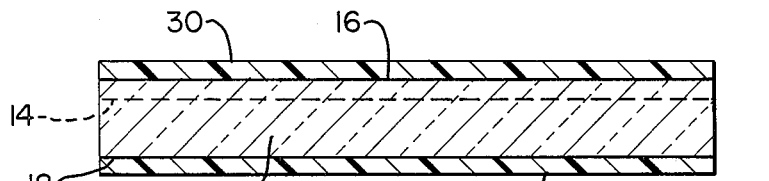
FIGS. 4A – 4E are sectional views in-side elevation of a solar cell at successive stages of the process of FIG. 3.
Figure 4B:
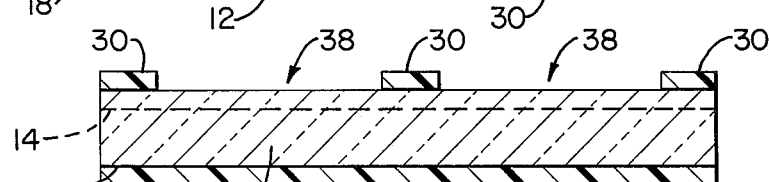
Figure 4C:
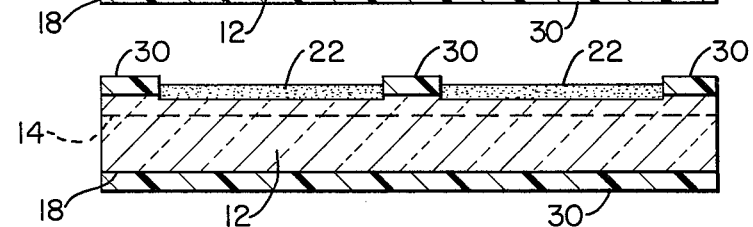
Figure 4D:
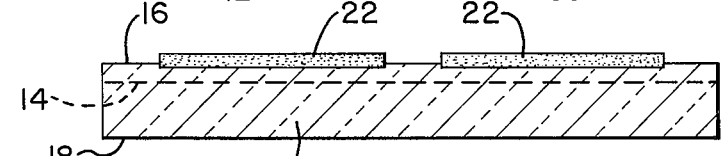

The first step starts with a silicon solar cell as shown in FIG. 1 but lacking the electrodes. Surfaces 16 and 18 of body 10 are then covered by a conventional photoresist material such as a polymethyl methacrylate positive resist material 30 (FIG. 4A) in known manner at a resist station 32. Then a resist image is defined on the surface of the cell in known manner, e.g. as by masking off the photo resist layer 30 so that selected areas thereof are exposed according to the negative of a selected electrode grid pattern, and subsequently the exposed areas of the photoresist are irradiated by a light beam at an exposure station 34, whereby they are altered to a lower molecular weight polymer. The silicon body 10 is then immersed in a preferential solvent or etchant such as methyl isobutyl ketone at a solvent station 36, with the result that the unexposed areas of the resist coating 30 remain intact while the exposed areas are dissolved away as represented at 38 in FIG. 4B to expose portions of surface 16.

The anti-reflective coating is then applied to surface 16 using the three process steps represented at 24, 26 and 28 in FIG. 2.

After step 28, the remaining photo-resist layer on surfaces 16 and 18 are removed in known manner. For example, the cell may be exposed to light at a second exposure station 40 so as to alter the remaining resist to a lower molecular weight polymer, and the resist is then totally removed by immersion in a suitable solvent or etchant in a second solvent station 42. This leaves exposed areas of surface 16 which conform to the desired electrode grid pattern. The external surface 18 also is exposed.

Figure 4E:
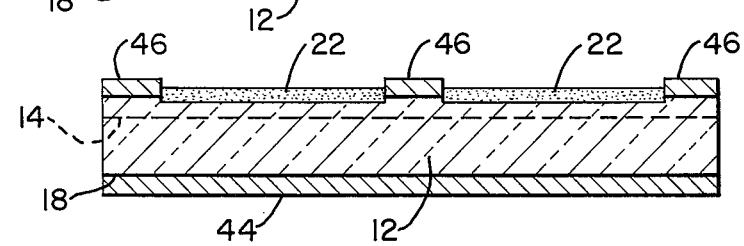

The final step is to apply electrodes 44 and 46 to the newly exposed portions of cell surfaces 16 and 18 (FIG. 4E) in known manner at a plating station 50. The electrodes may be laminates formed by evaporation deposition and comprising a layer of aluminum attached to the silicon body and a layer of silver bonded to the aluminum layer. Other electrode materials may also be used and the electrodes may be formed by other techniques known to persons skilled in the art. For example, two or more of stations 32, 34 and 36 may be combined as a single station in known manner.

The following examples illustrate more clearly how anti-reflective coatings are produced on silicon solar cells according to the preferred form of the invention. The invention, however, should not be construed as being limited to the particular embodiments set forth in the Examples.

EXAMPLE I

An acidic treating solution is prepared by mixing three parts of 49% HF (bottled concentration) and one part of 30% $H_2O_2$ (stabilized) (all parts by volume). The two components are miscible. The solution is maintained at room temperature.

A silicon solar cell of the type which has electrodes attached thereto as shown in FIG. 1 is immersed in the treating mixture for 3 seconds. The solar cell is then removed from the treating solution, is immediately washed with deionized water, and dried under nitrogen. A dark blue stain coating is formed on the areas of silicon which were exposed to the treating solution. The electrodes appear substantially unchanged. A section taken across the solar cell appears substantially as shown in FIG. 1 of the drawing and the coating is approximately 0.13 microns thick. The P-N junction depth appears to be approximately 0.07 microns thinner immediately below the stained areas of the cell. The resulting solar cell has a reflectivity of about 5% when exposed to a sunlamp. Reflectivity of the same cell without the anti-reflection coating is about 30%. The short circuit current density of the coated cell is measured to be about 30 ma/cm$^2$ which is about 30% increase as compared to the same cell without the anti-reflection coating. Eighty three percent of the observed increase of current density is believed attributable to the corresponding 25% reduction in reflectivity. The remaining (17%) gain is believed attributable to improved cell efficiency resulting from thinning of the junction.

The coated cell is tested for thermal stability as follows: The coated cell is heated to a surface temperature of 150° C for 1000 hours. No change is observed in either the physical appearance of the coating or the short circuit current density.

EXAMPLE II

An acidic treating solution is prepared by mixing 1 part of 30% $H_2O_2$ (stabilized), 3 parts of 49% HF (bottle concentration) and 30 parts of deionized water (all parts by volume).

A silicon solar cell as in Example I is treated, washed and dried as in Example I with the following change - treating time is about 25 seconds.

A silicon solar cell having an anti-reflective coating similar in appearance and performance to that produced in accordance with Example I results. Diluting the acidic treating solution lengthens the process time which may facilitate control.

EXAMPLE III

The purpose of this Example is to show the effect of varying the respective amounts of HF and $H_2O_2$ in the acidic treating solution. The following treating solutions are prepared (all parts by volume), and are applied to silicon solar cells for the indicated times:

(a) 20 parts of HF and 1 part of $H_2O_2$, treating time 30 seconds;

(b) 10 parts of HF and 1 part of $H_2O_2$, treating time 15 seconds;

(c) 5 parts of HF and 1 part of $H_2O_2$, treating time 10 seconds;

Results — An anti-reflection coating of approximately 0.13 microns thick is formed on each cell.

Conclusions — Varying the formulation of the acidic treating solution, varies the treating time required to form an anti-reflective coating of desired thickness.

It is believed that other oxidation agents which are not particularly corrosive to the electrode grid, e.g. $HNO_3$, may be used in place of $H_2O_2$ and may result in the formation of similar anti-reflective stain coatings on silicon solar cells.

It should be apparent from the foregoing, the present invention provides a novel and effective anti-reflective coating for silicon solar cells. Furthermore, the anti-reflective coating of the present invention is comparable to prior art coatings in terms of reflectivity characteristics and sensitivity to heat. More importantly, the anti-reflective coating of the present invention may be formed by a novel method using readily available and inexpensive equipment and materials. Furthermore, the method offers advantages of being relatively inexpensive, ease of application, and consistency. An additional advantage is that the coating may be formed without having to protect the electrodes.

The depth of the photo-voltaic junction of silicon cells treated in accordance with the process of the present invention is found to be slightly thinned adjacent the anti-reflective coating by the process associated with the formation of the coating. It is believed that some of the silicon adjacent the cell surface is consumed in the formation of the anti-reflective coating. Whatever the reason for this observed thinning of the junction depth, the conversion efficiency of a cell having an anti-reflective coating formed in accordance with the present invention thus appears to be further improved.

Since certain changes may be made in the above process and product without departing from the scope of the invention, herein involved, it is intended that all matter contained in the description or shown in the accompanying drawing shall be interpreted in an illustrative and not in a limiting sense.

What is claimed is:

1. A silicon solar cell having an active silicon radiation-receiving surface, and an anti-reflective coating over at least a portion of said active silicon radiation-receiving surface, said coating having a thickness in the range of from 0.07 to 0.15 microns, and being formed by treating said active silicon radiation-receiving surface of said cell with an acidic solution comprising a mixture of HF and $H_2O_2$.

2. A solar cell according to claim 1 wherein said coating has a thickness of about 0.13 microns.

3. A solar cell according to claim 1 wherein said coating has a thickness of about 0.07 microns.

4. A silicon solar cell according to claim 1 wherein said cell comprises silicon of P-type conductivity which has been treated to provide a zone of N-type conductivity and a P-N junction adjacent the radiation-receiving surface thereof.

5. Method of forming an anti-reflective coating over at least a portion of the active silicon radiation-receiving surface of a silicon solar cell, said method comprising the step of treating said radiation-receiving surface of said cell with an acidic solution comprising a mixture of HF and $H_2O_2$ long enough to form thereon a coating having a thickness in the range of about 0.07 to 0.15 microns, and then terminating such treatment and washing the resulting coating.

6. Method according to claim 5 including the step of dispersing said acidic solution in a diluent which is non-corrosive to silicon.

7. Method according to claim 6 wherein said diluent is a member selected from the group consisting of water, acetic acid, phosphoric acid and mixtures of two or more of said members.

8. Method according to claim 5 wherein said cell is treated for a time sufficient to form a coating having a thickness of about 0.13 microns.

9. Method according to claim 5 wherein said cell is treated for a time sufficient to form a coating having a thickness of about 0.07 microns.

10. Method according to claim 5 including the step of forming an electrode over selected portions of said radiation receiving surface of said cell prior to treating said cell to form said anti-reflective coating.

11. Method according to claim 5 wherein said solution comprises HF and $H_2O_2$ in a ratio of from about 10 to about 2 parts by weight of HF to from about 2 to about 1 parts by weight of $H_2O_2$.

12. Method according to claim 5 wherein said silicon solar cell comprises semi-conductor silicon of P-type conductivity which has been treated to provide a zone of N-type conductivity and a P-N junction near the surface which is to form the active silicon radiation-receiving surface of the cell.

13. A method of enhancing the photo-electric conversion efficiency of a silicon solar cell having an active silicon radiation-receiving surface, said method comprising treating the active silicon radiation-receiving surface of said cell with a mixture of HF and $H_2O_2$ so as to substantially simultaneously (1) form an anti-reflective coating on said active silicon radiation-receiving surface and (2) reduce the depth of said junction from said active silicon radiation-receiving surface.

14. Method according to claim 13 wherein said silicon solar cell comprises semi-conductor silicon of P-type conductivity which has been treated to provide a zone of N-type conductivity and a P-N junction near the surface which is to form the active silicon radiation-receiving surface of the cell.

15. A method of enhancing the photo-electric conversion efficiency of a silicon solar cell having an active silicon radiation-receiving surface and a junction lying below said active silicon radiation-receiving surface, said method comprising chemically treating the active silicon radiation-receiving surface of said cell with a mixture of HF and $H_2O_2$ so as to substantially simultaneously (1) form an anti-reflective coating on said active silicon radiation-receiving surface and (2) reduce the depth of said junction from said active silicon radiation-receiving surface.

16. Method according to claim 15 wherein said silicon solar cell comprises semi-conductor silicon of P-type conductivity which has been treated to provide a zone of N-type conductivity and a P-N junction near the surface which is to form the active silicon radiation-receiving surface of the cell.

* * * * *